United States Patent [19]
Manning

[11] Patent Number: 5,831,931
[45] Date of Patent: *Nov. 3, 1998

[54] ADDRESS STROBE RECOGNITION IN A MEMORY DEVICE

[75] Inventor: Troy Manning, Boise, Id.

[73] Assignee: Micron Technology, Inc., Boise, Id.

[ * ] Notice: The term of this patent shall not extend beyond the expiration date of Pat. No. 5,682,354.

[21] Appl. No.: 890,418

[22] Filed: Jul. 9, 1997

Related U.S. Application Data

[63] Continuation of Ser. No. 553,986, Nov. 6, 1995, Pat. No. 5,682,354.

[51] Int. Cl.$^6$ .................................................. G11C 8/00
[52] U.S. Cl. ................................. 365/233.5; 365/230.08; 365/239
[58] Field of Search ................................. 365/233.5, 236, 365/239, 230.08

[56] References Cited

U.S. PATENT DOCUMENTS

| | | | |
|---|---|---|---|
| 4,344,156 | 8/1982 | Eaton et al. | 365/203 |
| 4,484,308 | 11/1984 | Lewandowski et al. | 364/900 |
| 4,510,603 | 4/1985 | Catiller | 371/21 |

(List continued on next page.)

FOREIGN PATENT DOCUMENTS

| | | |
|---|---|---|
| 0468480 | 1/1992 | European Pat. Off. . |
| 0547890 | 6/1993 | European Pat. Off. . |
| 19507562 | 9/1995 | Germany . |

OTHER PUBLICATIONS

"DRAM 1 Meg X 4 DRAM 5VEDO Page Mode",, *1995 DRAM Data Book,*, pp. 1–1 thru 1–30,, (Micron Technology, I).

"Rossini, Pentium, PCI–ISA, Chip Set", *Symphony Laboratories,*, entire book.

"4DRAM 1991", *Toshiba America Electronic Components, Inc.*, pp. A–137–A–159.

"Application Specific DRAM", *Toshiba America Electronic Components, Inc.*, C178, C–260, C 218, (1994).

"Burst DRAM Function & Pinout", *Oki Electric Ind., Co., Ltd., 2nd Presentation, Item #619*, (Sep. 1994).

"Hyper page mode DRAM", *8029 Electronic Engineering 66, No. 813*, Woolwich, London GB, pp. 47–48, (Sep. 1994).

"Hyper Page Mode DRAM", *Electronic Engineering*, vol. 66, No. 813, pp. 47–48, (Sep. 1994).

"Hyper Page Mode DRAM", *Electronic Engineering*, 66, No. 813,, Woolwich, London, GB, pp. 47–48, (Sep. 1994).

"Hyper Page Mode DRAM", *Electronic Engineering 8029*, No., 813, Woolwich, London, GB, pp. 47–48, (Sep. 1994).

"Hyper Page Mode DRAM", *Electronic Engineering*, 66, No. 813, pp. 47–48, (Sep. 1994).

"Micron Semiconductor, Inc.", *1994 DRAM Data Book, entire book,*.

"Mosel–Vitelic V53C8257H DRAM Specification Shhet, 20 pages, Jul. 2, 1994".

"Pipelined Burst DRAM", *Toshiba, JEDEC JC 42.3 Hawaii*, (Dec. 1994).

"Samsung Synchronous DRAM", *Revision 1*, Samsung Electronics, 1–16, (Mar., 1993).

(List continued on next page.)

*Primary Examiner*—David C. Nelms
*Assistant Examiner*—Hoai V. Ho
*Attorney, Agent, or Firm*—Schwegman, Lundberg, Woessner & Kluth, P.A.

[57] ABSTRACT

An integrated memory circuit is described which can be operated in a burst access mode. The memory circuit includes an address counter which changes column addresses in one of a number of predetermined patterns. The memory includes generator circuit for generating an internal control signal based upon external column address signals. The generator circuit detects the first active transition of the column address signals and the first inactive transition of the column address signals.

5 Claims, 7 Drawing Sheets

U.S. PATENT DOCUMENTS

| | | | |
|---|---|---|---|
| 4,513,389 | 4/1985 | Devchoudhury | 364/900 |
| 4,562,555 | 12/1985 | Ouchi et al. | 365/233 |
| 4,567,579 | 1/1986 | Patel et al. | 365/189 |
| 4,575,825 | 3/1986 | Ozaki et al. | 365/189 |
| 4,603,403 | 7/1986 | Toda | 365/189 |
| 4,618,947 | 10/1986 | Tran et al. | 365/230 |
| 4,636,986 | 1/1987 | Pinkham | 365/195 |
| 4,649,522 | 3/1987 | Kirsch | 365/189 |
| 4,685,089 | 8/1987 | Patel et al. | 365/233 |
| 4,707,811 | 11/1987 | Takemae et al. | 365/239 |
| 4,750,839 | 6/1988 | Wang et al. | 365/233 |
| 4,788,667 | 11/1988 | Nakano | 365/193 |
| 4,799,199 | 1/1989 | Scales et al. | 365/230 |
| 4,870,622 | 9/1989 | Aria et al. | 365/230 |
| 4,875,192 | 10/1989 | Matsumoto | 365/193 |
| 4,926,314 | 5/1990 | Dhuey | 364/200 |
| 4,984,217 | 1/1991 | Sato | 365/230 |
| 5,058,066 | 10/1991 | Yu | 365/189.05 |
| 5,083,296 | 1/1992 | Hara et al. | 365/230 |
| 5,126,975 | 6/1992 | Handy et al. | 365/230 |
| 5,210,723 | 5/1993 | Bates et al. | 365/238.5 |
| 5,237,689 | 8/1993 | Behnke | 395/700 |
| 5,253,357 | 10/1993 | Allen et al. | 395/425 |
| 5,267,200 | 11/1993 | Tobita | 365/189 |
| 5,268,865 | 12/1993 | Takasugi | 365/189 |
| 5,280,594 | 1/1994 | Young et al. | |
| 5,301,278 | 4/1994 | Bowater et al. | 395/275 |
| 5,305,284 | 4/1994 | Iwase | 365/238.5 |
| 5,319,759 | 6/1994 | Chan | 395/400 |
| 5,323,352 | 6/1994 | Miyata et al. | 365/222 |
| 5,325,330 | 6/1994 | Morgan | 365/189.05 |
| 5,325,502 | 6/1994 | McLaury | 395/425 |
| 5,333,305 | 7/1994 | Neufeld | 395/575 |
| 5,339,276 | 8/1994 | Takasugi | 365/230 |
| 5,349,566 | 9/1994 | Merritt et al. | 365/233.5 |
| 5,357,469 | 10/1994 | Sommer et al. | 365/193 |
| 5,373,227 | 12/1994 | Keeth | 323/313 |
| 5,379,261 | 1/1995 | Jones, Jr. | 365/230 |
| 5,386,385 | 1/1995 | Stephens, Jr. | 365/189.05 |
| 5,392,239 | 2/1995 | Margulis et al. | 365/189 |
| 5,394,535 | 2/1995 | Ohuchi | 395/425 |
| 5,400,292 | 3/1995 | Fukiage et al. | 365/230.01 |
| 5,410,670 | 4/1995 | Hansen et al. | 395/425 |
| 5,436,869 | 7/1995 | Yoshida | 365/230 |
| 5,449,941 | 9/1995 | Yamazaki et al. | 257/411 |
| 5,452,261 | 9/1995 | Chung et al. | 365/233 |
| 5,454,107 | 9/1995 | Lehman et al. | 395/480 |
| 5,457,659 | 10/1995 | Schaefer | 365/222 |
| 5,483,498 | 1/1996 | Hotta | 365/233.5 |
| 5,485,428 | 1/1996 | Lin | 365/221 |
| 5,487,049 | 1/1996 | Hang | 365/221 |
| 5,513,148 | 4/1996 | Zager | 365/233 |
| 5,522,064 | 5/1996 | Aldereguia et al. | 395/550 |
| 5,526,320 | 6/1996 | Zagar et al. | 365/233.5 |
| 5,598,376 | 1/1997 | Merritt et al. | 365/230.06 |

OTHER PUBLICATIONS

"Samsung Synchronous DRAM", *Samsung Electronics*, pp. 1–16, (Mar. 1993).

"Synchronous DRAM 2 MEG cx 8 SDRAM", *Micron Semiconductor, Inc.*, pp. 2–43 through 2–8.

Bursky, D., "Novel I/O Options and Innovative Architectures Let DRAMs Achieve SRAM Performance; Fast DRAMS can be swapped for SRAM Caches", *Electronic Design*, vol. 41, No. 15, Cleveland, Ohio, pp. 55–67, (Jul. 22, 1993).

Gowni, S.P., et al., "A 9NS, 32K X 9, BICMOS TTL Synchronous Cache RAM With Burst Mode Access", *IEEE*, Custom Integrated Circuits Conference, pp. 781–786, (Mar. 3, 1992).

Gowni, et al., "Synchronous Cache RAM with Burst ;Mode Access", *IEEE 1992 Custom Integrated Circuits Conference*, Boston USA, pp. 781–784, (May 1992).

FIG. 5

| Burst Length | Starting Column Address | | | Linear | Interleave |
|---|---|---|---|---|---|
| | $A_2$ | $A_1$ | $A_0$ | | |
| 2 | V | V | 0 | 0-1 | 0-1 |
| | V | V | 1 | 1-0 | 1-0 |
| 4 | V | 0 | 0 | 0-1-2-3 | 0-1-2-3 |
| | V | 0 | 1 | 1-2-3-0 | 1-0-3-2 |
| | V | 1 | 0 | 2-3-0-1 | 2-3-0-1 |
| | V | 1 | 1 | 3-0-1-2 | 3-2-1-0 |
| 8 | 0 | 0 | 0 | 0-1-2-3-4-5-6-7 | 0-1-2-3-4-5-6-7 |
| | 0 | 0 | 1 | 1-2-3-4-5-6-7-0 | 1-0-3-2-5-4-7-6 |
| | 0 | 1 | 0 | 2-3-4-5-6-7-0-1 | 2-3-0-1-6-7-4-5 |
| | 0 | 1 | 1 | 3-4-5-6-7-0-1-2 | 3-2-1-0-7-6-5-4 |
| | 1 | 0 | 0 | 4-5-6-7-0-1-2-3 | 4-5-6-7-0-1-2-3 |
| | 1 | 0 | 1 | 5-6-7-0-1-2-3-4 | 5-4-7-6-1-0-3-2 |
| | 1 | 1 | 0 | 6-7-0-1-2-3-4-5 | 6-7-4-5-2-3-0-1 |
| | 1 | 1 | 1 | 7-0-1-2-3-4-5-6 | 7-6-5-4-3-2-1-0 |

ADDRESS STROBE RECOGNITION IN A MEMORY DEVICE

This application is a continuation of U.S. patent application Ser. No. 08/553,986, filed Nov. 6, 1995 now U.S. Pat. No. 5,682,354.

FIELD OF THE INVENTION

This invention relates to memory device architectures designed to provide high density data storage with high speed read and write access cycles. In particular, this invention relates to memory devices having multiple column address signals.

BACKGROUND OF THE INVENTION

Dynamic Random Access Memory devices (DRAMs) are among the highest volume and most complex integrated circuits manufactured today. Except for their high volume production, the state of the art manufacturing requirements of these devices would cause them to be exorbitantly priced. Yet, due to efficiencies associated with high volume production, the price per bit of these memory devices is continually declining. The low cost of memory has fueled the growth and development of the personal computer. As personal computers have become more advanced, they in turn have required faster and more dense memory devices, but with the same low cost of the standard DRAM. Fast page mode DRAMs are the most popular standard DRAM today. In fast page mode operation, a row address strobe (RAS*) is used to latch a row address portion of a multiplexed DRAM address. Multiple occurrences of the column address strobe (CAS*) are then used to latch multiple column addresses to access data within the selected row. On the falling edge of CAS* an address is latched, and the DRAM outputs are enabled. When CAS* transitions high the DRAM outputs are placed in a high impedance state (tri-state). With advances in the production of integrated circuits, the internal circuitry of the DRAM operates faster than ever. This high speed circuitry has allowed for faster page mode cycle times. A problem exists in the reading of a DRAM when the device is operated with minimum fast page mode cycle times. CAS* may be low for as little as 15 nanoseconds, and the data access time from CAS* to valid output data (tCAC) may be up to 15 nanoseconds; therefore, in a worst case scenario there is no time to latch the output data external to the memory device. For devices that operate faster than the specifications require, the data may still only be valid for a few nanoseconds. On a heavily loaded microprocessor memory bus, trying to latch an asynchronous signal that is valid for only a few nanoseconds is very difficult. Even providing a new address every 35 nanoseconds requires large address drivers which create significant amounts of electrical noise within the system. To increase the data throughput of a memory system, it has been common practice to place multiple devices on a common bus. For example, two fast page mode DRAMs may be connected to common address and data buses. One DRAM stores data for odd addresses, and the other for even addresses. The CAS* signal for the odd addresses is turned off (high) when the CAS* signal for the even addresses is turned on (low). This interleaved memory system provides data access at twice the rate of either device alone. If the first CAS* is low for 20 nanoseconds and then high for 20 nanoseconds while the second CAS* goes low, data can be accessed every 20 nanoseconds or 50 megahertz, If the access time from CAS* to data valid is fifteen nanoseconds, the data will be valid for only five nanoseconds at the end of each 20-nanosecond period when both devices are operating in fast page mode. As cycle times are shortened, the data valid period goes to zero.

There is a demand for faster, higher density, random access memory integrated circuits which provide a strategy for integration into today's personal computer systems. In an effort to meet this demand, numerous alternatives to the standard DRAM architecture have been proposed. One method of providing a longer period of time when data is valid at the outputs of a DRAM without increasing the fast page mode cycle time is called Extended Data Out (EDO) mode. In an EDO DRAM the data lines are not tri-stated between read cycles in a fast page mode operation. Instead, data is held valid after CAS* goes high until sometime after the next CAS* low pulse occurs, or until RAS* or the output enable (OE*) goes high. Determining when valid data will arrive at the outputs of a fast page mode or EDO DRAM can be a complex function of when the column address inputs are valid, when CAS* falls, the state of OE* and when CAS* rose in the previous cycle. The period during which data is valid with respect to the control line signals (especially CAS*) is determined by the specific implementation of the EDO mode, as adopted by the various DRAM manufacturers.

Memory devices which use multiple column address signals (CAS*) have difficulty producing reliable control signals based upon the CAS* signals. The CAS* signals are traditionally combined in a logical AND manner, a procedure which is highly susceptible to timing skew between the signals. A memory device is needed which can operate at faster data rates and produce control signals based upon multiple external column address signals which is less susceptible to timing skew between the address signals.

SUMMARY OF THE INVENTION

The above mentioned problems with high data rate memory devices and other problems are addressed by the present invention and which will be understood by reading and studying the following specification. A memory device is described which operates in a burst access mode and includes an internal column address signal generator. The signal generator circuit uses multiple external column address signals to produce one signal which transitions to an active state in response to a level transition in the external address latch signals and transitions to an in-active state in response to a second level transition in the external address latch signals.

In particular, the present invention describes a memory device having a plurality of addressable memory elements comprising address circuitry adapted to operate the memory device in a burst access mode, a plurality of external address latch signals, and a generator circuit responsive to the plurality of external address latch signals to generate a control signal which transitions to an active state in response to a first logic level transition in one of the plurality of external address latch signals and transitions to an in-active state in response to a second logic level transition in one of the plurality of external address latch signals.

The generator circuit can comprise an output circuit coupled to the plurality of external address latch signals, the output circuit being responsive to the first logic level transition in the plurality of external address latch signals, a plurality of trigger circuits coupled to the plurality of external address latch signals, and an enable circuit coupled to the plurality of trigger circuits and the output circuit, the enable circuit being responsive to the second logic level transition in the plurality of external address latch signals to disable the output circuit. In one embodiment, the output circuit comprises an enabled logic gate, which can be a NAND gate.

In another embodiment, an integrated memory circuit comprises a memory array having a plurality of addressable memory cells, and a generator circuit responsive to a plurality of external address latch signals to generate a control signal which transitions to an active state in response to a first logic level transition in one of the plurality of external address latch signals and transitions to an in-active state in response to a second logic level transition in one of the plurality of external address latch signals. The memory also comprises an address counter to receive a first memory cell address and adapted to generate a series of memory cell addresses in response to the control signal.

In still another embodiment, a method of generating a control signal in a memory device is described. The method comprising the steps of receiving a first external address latch signal, receiving a second external address latch signal, and detecting a transition from a first logic state to a second logic state in either the first external address latch signal or the second external address latch signal. The method further comprises the steps of transitioning the control signal in response to the detection of the transition from a first logic state to a second logic state, detecting a transition from the second logic state to the first logic state in either the first external address latch signal or the second external address latch signal, and transitioning the control signal in response to the detection of the transition from the second logic state to the first logic state.

In still another embodiment, a method of generating an active low control signal in a memory device is described. The method comprising the steps of receiving a first active low column address signal, receiving a second active low column address signal, detecting a first high to low transition in either the first or second active low column address signal, and transitioning the active low control signal from a high to low logic state in response to the detected high to low transition. The method also included the steps of detecting a first low to high transition in either the first or second active low column address signal, and transitioning the active low control signal from a low to a high logic state in response to the detected low to high transition.

BRIEF DESCRIPTION OF THE DRAWINGS

FIG. 5 is a table showing linear and interleaving addressing formats;

DETAILED DESCRIPTION OF THE PREFERRED EMBODIMENT

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

Figure 1:
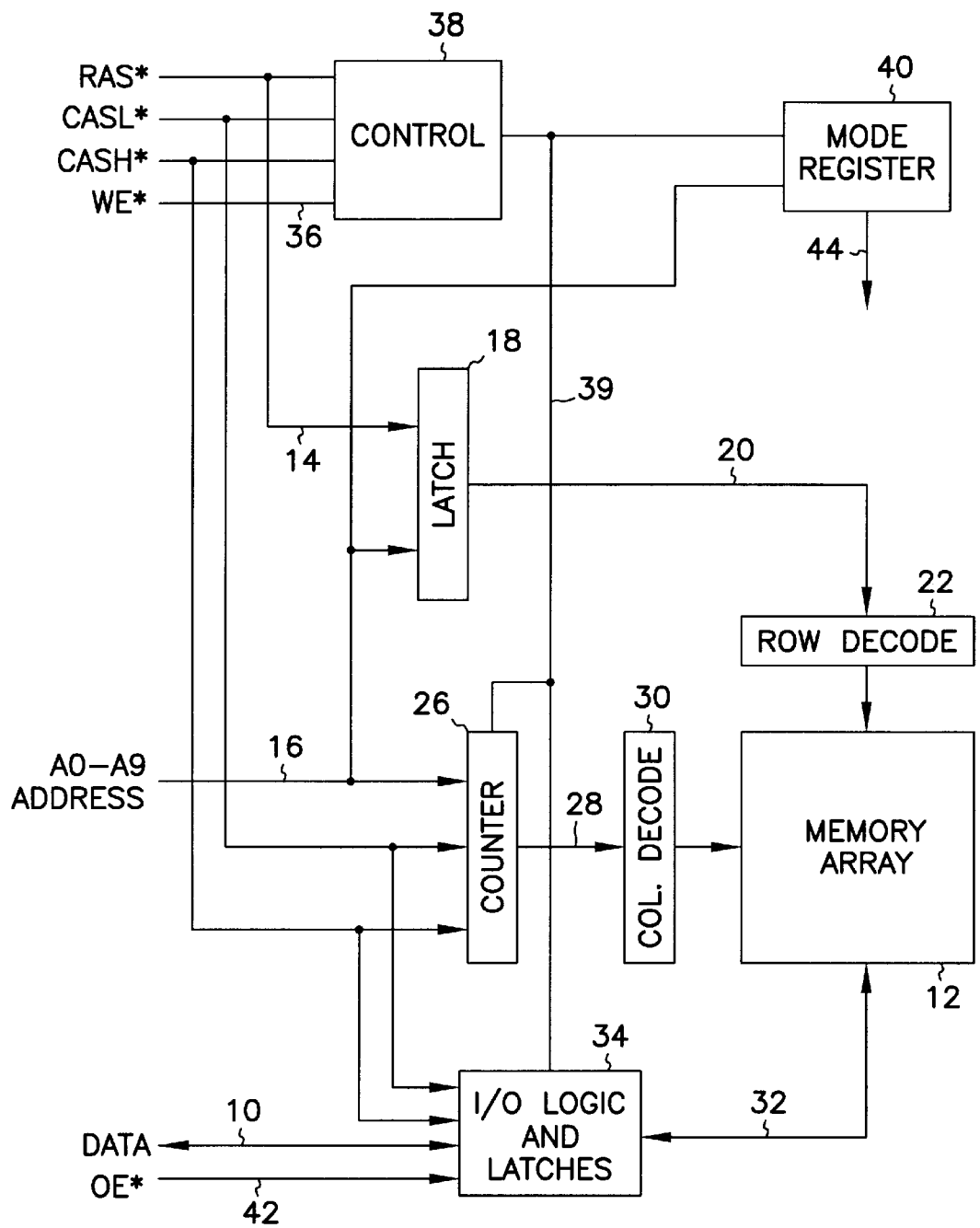
FIG. 1 is a schematic diagram of a memory device in accordance with one embodiment of the present invention.

FIG. 1 is a schematic representation of a sixteen megabit device designed in accordance with the present invention. The device is organized as a 1 Meg×16 burst EDO DRAM having a sixteen bit data input/output path 10 providing data storage for 2,097,152 bytes of information in the memory array 12. The device of FIG. 1 has an industry standard pinout for sixteen bit wide EDO DRAMs. An active-low row address strobe (RAS*) signal 14 is used to latch a first portion of a multiplexed memory address, from address inputs A0 through A9 16, in latch 18. The latched row address 20 is decoded in row decoder 22. The decoded row address is used to select a row of the memory array 12. A sixteen bit wide burst EDO mode DRAM has two column address strobe input pins CASH* and CASL*. CASH* and/or CASL* are used to latch a second portion of a memory address from address inputs 16 into column address counter 26. The latched column address 28 is decoded in column address decoder 30. The decoded column address is used to select a column of the memory array 12. Use of either CASH* or CASL* will access one byte of the memory, while use of both CASH* and CASL* accesses two bytes of the memory. In a sixteen bit memory device, an internal timing signal referred to here in as BEDOCAS* is used control timing function in the memory and generated from CASH* and/or CASL*, as explained in detail below.

BEDOCAS* Generator Circuit

Figure 2:
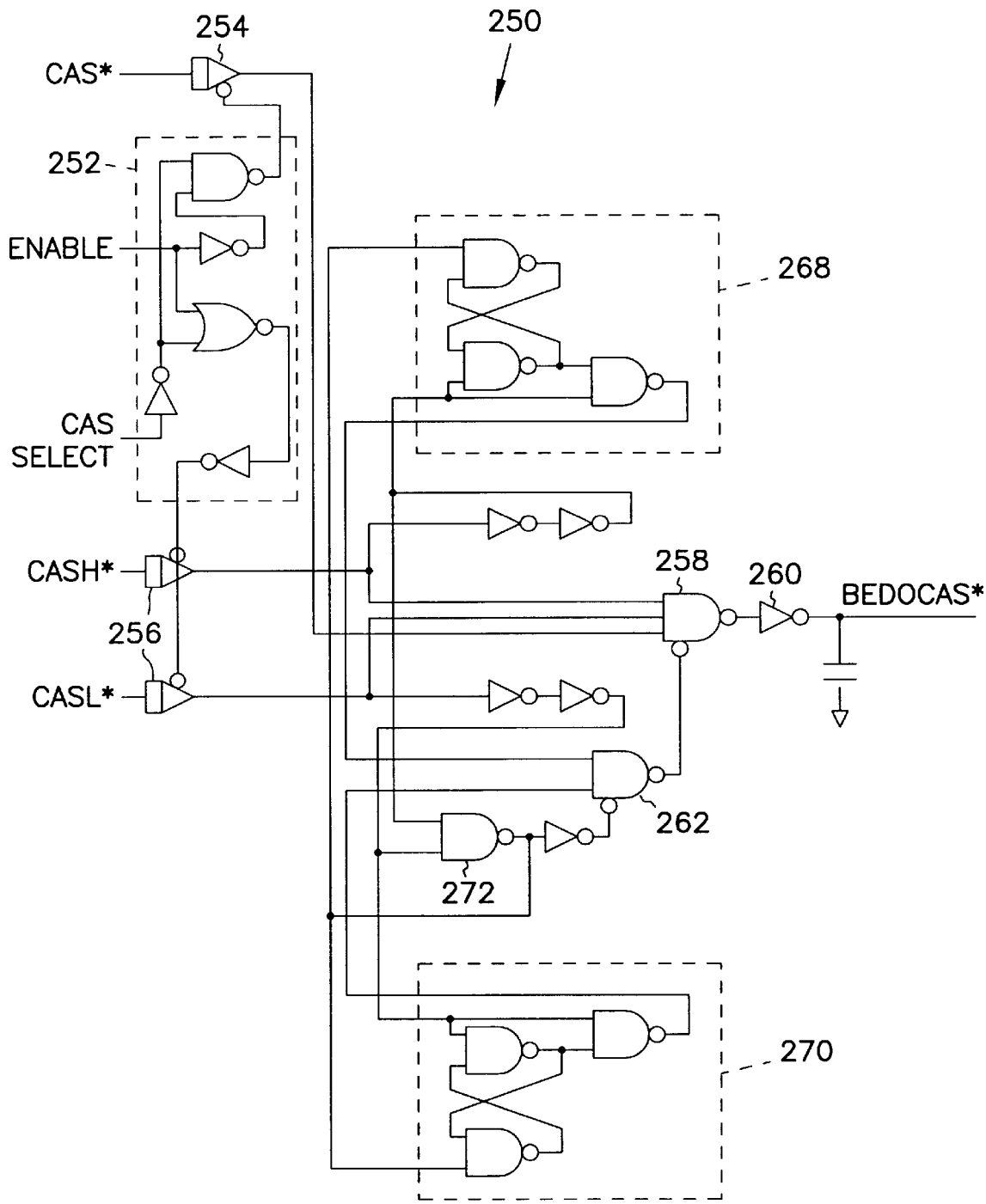
FIG. 2 is a schematic diagram of a signal generator circuit of the present invention.

A BEDOCAS* generator circuit 250 is included in control 38 of the memory circuit and described below with reference to the schematic diagram of FIG. 2. The circuit shown can be used in a burst memory device having an eight bit data width which uses only one CAS* signal, or in a sixteen bit memory which uses multiple CAS signals, CASL* and CASH*. When using multiple CAS signals, a system is susceptible to clock skew between the signals. That is, the CAS signals are used internally to create a signal referred to as BEDOCAS*. BEDOCAS* is, therefore, a function of all CAS signals and should go low when any one of the CAS signals goes low.

Figure 3:
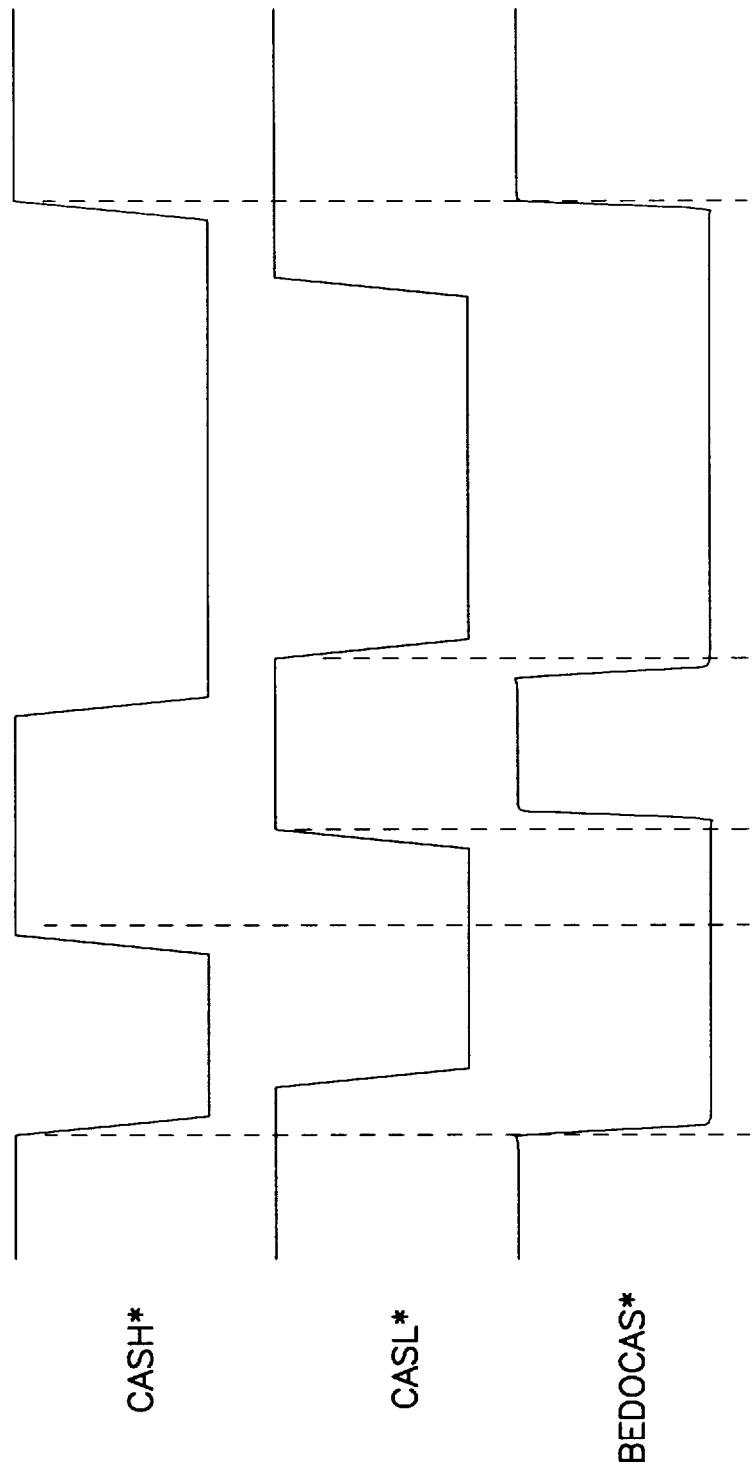
FIG. 3 is a timing diagram of a BEDOCAS* signal using AND logic.

A simple AND gate circuit (not shown) could be used to generate BEDOCAS*. A problem, however, arises when the CAS signals are skewed. FIG. 3 illustrates a BEDOCAS* signal generated using a AND gate and two skewed CAS*signals, CASH* and CASL*. The BEDOCAS* signal goes low with the first falling edge of CASH* and remains low until the rising edge of CASL*. The BEDOCAS* signal returns low on the next falling edge and remains low until both CAS*signals are high. The BEDOCAS* high signal is used internal to the memory to cycle several time critical devices. It will be appreciated that as the CAS*to CAS*skew increases, the BEDOCAS* high signal is decreased to the point where memory specifications are violated and memory failure occurs.

To eliminate the negative effects of CAS*to CAS*skew the BEDOCAS* generator 250 is provided. The BEDOCAS* signal generated is a function of the CAS*signals such that it will go low on the first low CAS*transition and return high on the first high transition. A 16 bit enable signal, CAS*Select, and a CAS*enable circuit 252 are used to enable either buffer 254 which is connected to single CAS* used in 8 bit memory devices, or buffers 256 connected to CASL* and CASH*. It will be understood that the output of buffers 254 and 256 will be held high if the enable signal is high. Conversely, NAND gates 258 and 262 will be coupled to ground if the enable signal is high. The output of buffers 254 and 256 are connected to enabled NAND gate 258. The output of NAND gate 258 is inverted by inverter 260 to produce BEDOCAS*. The output of NAND gate 262 is low when the circuit is operating in a single CAS*mode. NAND gate 262 is not enabled, when operating in a multiple CAS*mode, until either CASH* or CASL* goes low, as explained below.

Figure 4:
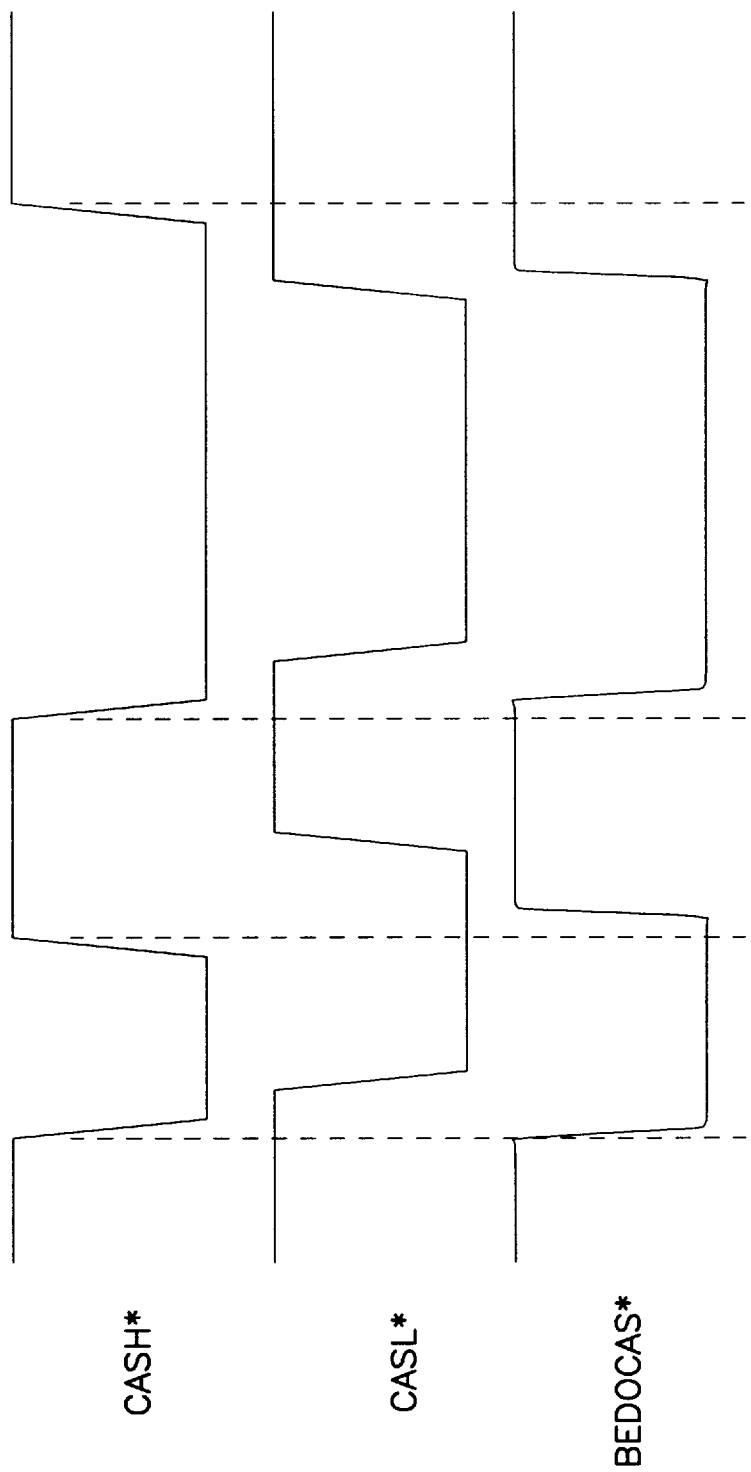
FIG. 4 is a timing diagram of the circuit of FIG. 2.

Trigger circuits 268 and 270 are used to monitor the external CASH* and CASL* signals for a first rising edge. NAND gate 258 is disabled in response to the trigger circuits such that BEDOCAS* goes high. The operation of BEDOCAS* generator circuit 250 for a 16 bit memory is explained below with reference to the CAS*signals in FIG. 4. The CAS*Select signal is high to indicate that the memory is a 16 bit memory. The Enable signal goes low after a memory row has been addressed, thereby indicating that a memory column can be powered. The CAS*enable circuit 252, therefore, disables buffer 254 and enables buffers 256 in response to Enable and CAS*Select. The inputs to NAND gate 258 are initially high. CASL* and CASH* are high such that the output of NAND gate 272 is low and NAND gate 262 is disabled. When CASH* goes low, the output of NAND gate 258 toggles high and BEDOCAS* goes low. The output of NAND gate 272 will go high, enabling NAND gate 262. The output of NAND gate 272 is also input into trigger circuits 268 and 270. The outputs of trigger circuits 268 and 270 are high and will remain high when CASL* goes low. When CASH* goes high, the output of trigger circuit 268 will go low such that the output of NAND gate 262 disables NAND gate 258 resulting in BEDOCAS* high. After both CASL* and CASH* go high, the BEDOCAS* generator circuit 250 is reset to monitor the CASL* and CASH* signals for a low transition.

Circuitry, therefore, is provided to generate one composite BEDOCAS* signal which goes low in response to the first external CAS*falling edge and returns high on the first external CAS*rising edge.

Burst Operation

In a burst read cycle, data within the memory array located at the row and column address selected by the row and column address decoders is read out of the memory array and sent along data path 32 to output latches 34. Data 10 driven from the burst EDO DRAM may be latched external to the device in synchronization with BEDOCAS* after a predetermined number of BEDOCAS* cycle delays (latency). For a two cycle latency design, the first BEDOCAS* falling edge is used to latch the initial address for the burst access. The first burst data from the memory is driven from the memory after the second BEDOCAS* falling edge, and remains valid through the third BEDOCAS* falling edge. Once the memory device begins to output data in a burst read cycle, the output drivers 34 will continue to drive the data lines without tri-stating the data outputs during BEDOCAS* high intervals dependent on the state of the output enable and write enable (OE* and WE*) control lines, thus allowing additional time for the system to latch the output data. Once a row and a column address are selected, additional transitions of the BEDOCAS* signal are used to advance the column address within the column address counter in a predetermined sequence. The time at which data will be valid at the outputs of the burst EDO DRAM is dependent only on the timing of the BEDOCAS* signal provided that OE* is maintained low, and OE* remains high. The output data signal levels may be driven in accordance with standard CMOS, TTL, LVTTL, GTL, or HSTL output level specifications.

The address may be advanced linearly, or in an interleaved fashion for maximum compatibility with the overall system requirements. FIG. 2 is a table which shows linear and interleaved addressing sequences for burst lengths of 2, 4 and 8 cycles. The "V" for starting addresses A1 and A2 in the table represent address values that remain unaltered through the burst sequence. The column address may be advanced with each BEDOCAS* transition, each pulse, or multiple of BEDOCAS* pulses in the event that more than one data word is read from the array with each column address. When the address is advanced with each transition of the BEDOCAS* signal, data is also driven from the part after each transition following the device latency which is then referenced to each edge of the BEDOCAS* signal. This allows for a burst access cycle where the highest switching control line (BEDOCAS*) toggles only once (high to low or low to high) for each memory cycle. This is in contrast to standard DRAMs which require CAS* to go low and then high for each cycle, and synchronous DRAMs which require a full clock cycle (high and low transitions) for each memory cycle. For maximum compatibility with existing EDO DRAM devices, the invention will be further described in reference to a device designed to latch and advance a column address on falling edges of the BEDOCAS* signal.

Figure 6:
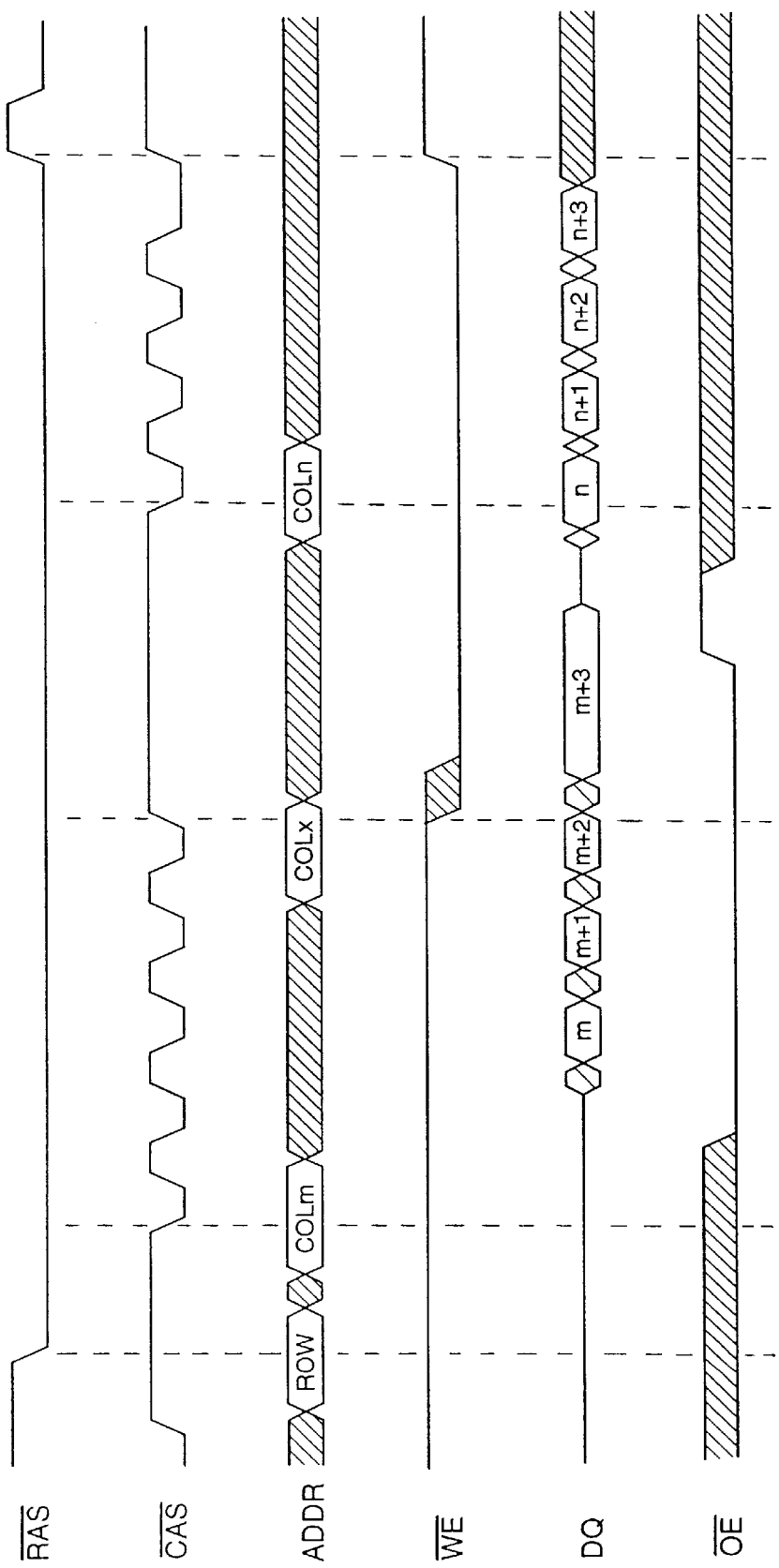
FIG. 6 is a timing diagram for a method of accessing the device of FIG. 1.

FIG. 6 is a timing diagram for performing a burst read followed by a burst write of the device of FIG. 1. In FIG. 6, a row address is latched by the RAS* signal. WE* is low when RAS* falls for an embodiment of the design where the state of the WE* pin is used to specify a burst access cycle at RAS* time. Next, BEDOCAS* is driven low with WE* high to initiate a burst read access, and the column address is latched. The data out signals (DQ's) are not driven in the first BEDOCAS* cycle. On the second falling edge of the BEDOCAS* signal, the internal address generation circuitry advances the column address and begins another access of the array, and the first data out is driven from the device after a BEDOCAS*. Additional burst access cycles continue, for a device with a specified burst length of four, until the fifth falling edge of BEDOCAS* which latches a new column address for a new burst read access. WE* falling in the fifth BEDOCAS* cycle terminates the burst access, and initializes the device for additional burst accesses. The sixth falling edge of BEDOCAS* with WE* low is used to latch a new burst address, latch input data and begin a burst write access of the device. Additional data values are latched on successive BEDOCAS* falling edges until RAS* rises to terminate the burst access.

Figure 7:
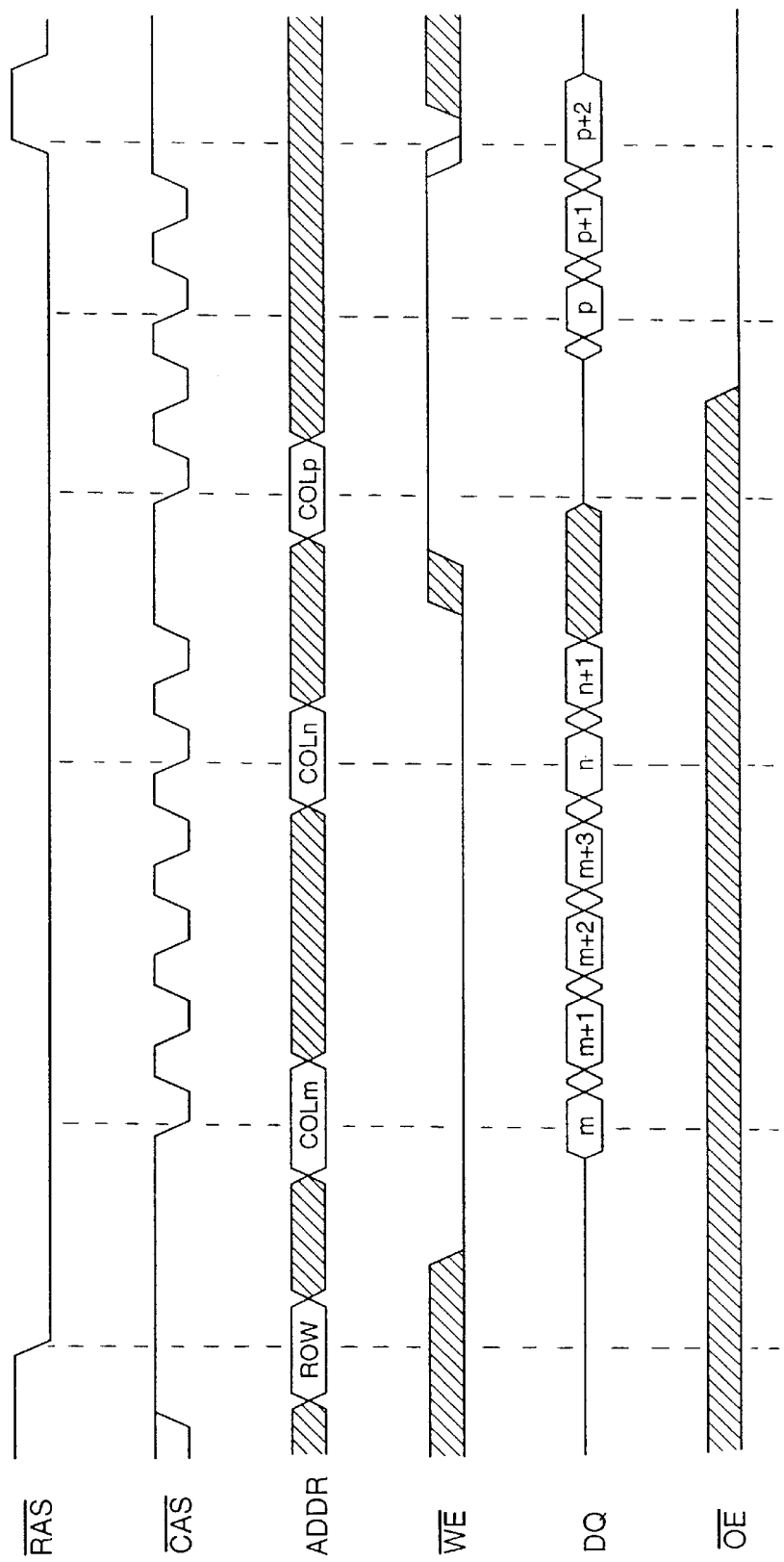
FIG. 7 is a timing diagram for another method of accessing the device of FIG. 1.

FIG. 7 is a timing diagram depicting burst write access cycles followed by burst read cycles. As in FIG. 6, the RAS* signal is used to latch the row address. The first BEDOCAS* falling edge in combination with WE* low begins a burst write access with the first data being latched. Additional data values are latched with successive BEDOCAS* falling edges, and the memory address is advanced internal to the device in either an interleaved or sequential manner. On the fifth BEDOCAS* falling edge a new column address and associated write data are latched. The burst write access cycles continue until the WE* signal goes high in the sixth-BEDOCAS* cycle. The transition of the WE* signal terminates the burst write access. The seventh BEDOCAS* low transition latches a new column address and begins a burst read access (WE* is high). The burst read continues until RAS* rises terminating the burst cycles.

For read cycles only CASL* needs to toggle. CASH* may be high or may toggle with CASL* during burst read cycles, all sixteen data bits will be driven out of part during a read cycle even if CASH* remains inactive. In a typical system application, a microprocessor will read all data bits on a data bus in each read cycle, but may only write certain bytes of data in a write cycle. Allowing one of the CAS* control signals to remain static during read cycles helps to reduce overall power consumption and noise within the system. For burst write access cycles, each of the CAS* signals (CASH* and CASL*) acts as a write enable for an eight bit width of the data. All sixteen data inputs will be latched when the first of the CAS* signals transitions low. If only one CAS* signal transitions low, then the eight bits of data associated with the CAS* that remained high will not be stored in the memory.

CONCLUSION

A memory device has been described which can operate in a burst access mode. The memory device has two external column address signals which are used to generate a single internal timing signal. A generator circuit is described which produces an active low timing signal which transitions low in response to the first low transition of one of the external column address signals, and transitions high in response to the first high transition of one of the external column address signals.

While the present invention has been described with reference to preferred embodiments, numerous modifications and variations of the invention will be apparent to one of skill in the art without departing from the scope of the invention. For example, the external address strobed can be active high or active low, and the BEDOCAS*generator circuit can be designed to produce an active high signal.

What is claimed is:

1. A memory device comprising:

a plurality of column address strobe signals; and means for providing a signal based upon the plurality of column address strobe signals such that the signal transitions to a low logic state in response to one of the plurality of column address strobe signals which transitions to a low logic state first, and the signal transitions to a high logic state in response to one of the plurality of column address strobe signals which transitions to a high logic state first.

2. The memory of claim 1 wherein the means for providing the signal comprise:

an enable circuit; and a plurality of trigger circuits.

3. The memory of claim 2 wherein the plurality of trigger circuits each comprise cross-coupled NAND gates.

4. A memory device comprising:

a column address strobe signal detection circuit comprising:

a first input coupled to a first column address strobe signal;

a second input coupled to a second column address strobe signal;

an output for providing an internal composite column address strobe signal;

a first latch having first and second inputs;

the first input coupled to the first CAS signal;

a second latch having first and second inputs;

the first input coupled to the second CAS signal;

a first NAND gate having first and second inputs coupled to the first and second CAS signals and an output coupled to the second inputs of both the first and second latches;

a second NAND gate having first and second inputs coupled to the outputs of the first and second latches, and an output coupled to enable a third NAND gate; and the third NAND gate having first and second inputs coupled to the first and second CAS signals, and an output coupled to the output of the column address strobe signal detection circuit.

5. The memory device of claim 4 further comprising:

an enable circuit coupled to the first and second inputs of the column address strobe signal detection circuit to decouple the first and second inputs from the first and second CAS signals, and couple a third CAS signal to a third input of the third NAND gate.

* * * * *